US012768918B2

(12) United States Patent
Gumbrecht

(10) Patent No.: US 12,768,918 B2
(45) Date of Patent: Oct. 20, 2026

(54) MONITORING A SPECIFIC ABSORPTION RATE DURING A MAGNETIC RESONANCE TOMOGRAPHY EXAMINATION WITH A MULTI-ELEMENT COIL

(71) Applicant: Siemens Healthineers AG, Forchheim (DE)

(72) Inventor: Rene Gumbrecht, Bamberg (DE)

(73) Assignee: Siemens Healthineers AG, Forchheim (DE)

( * ) Notice: Subject to any disclaimer, the term of this patent is extended or adjusted under 35 U.S.C. 154(b) by 196 days.

(21) Appl. No.: 18/756,144

(22) Filed: Jun. 27, 2024

(65) Prior Publication Data

US 2025/0004074 A1 Jan. 2, 2025

(30) Foreign Application Priority Data

Jun. 28, 2023 (DE) ..................... 10 2023 206 110.4

(51) Int. Cl.
*G01R 33/3415* (2006.01)
*G01R 33/28* (2006.01)

(52) U.S. Cl.
CPC ....... *G01R 33/3415* (2013.01); *G01R 33/288* (2013.01)

(58) Field of Classification Search
CPC ............ G01R 33/3415; G01R 33/3607; G01R 33/288; G01R 33/36; A61B 5/055
See application file for complete search history.

(56) References Cited

U.S. PATENT DOCUMENTS

2008/0182524 A1* 7/2008 Graesslin ............... H04B 17/23 455/73
2013/0147479 A1* 6/2013 Bielmeier .............. G01R 33/32 324/309

* cited by examiner

*Primary Examiner* — Lee E Rodak
*Assistant Examiner* — Demetrius R Pretlow
(74) *Attorney, Agent, or Firm* — Lempia Summerfield Katz LLC

(57) ABSTRACT

Monitoring a specific absorption rate of a subject during a magnetic resonance tomography examination with a magnetic resonance tomography system with a multi-element coil with several transmission channels, comprising the following steps: monitoring the transmission channels with an initial monitoring system to obtain initial monitoring signals; monitoring a subset of the transmission channels with a second monitoring system to obtain second monitoring signals; comparing the second monitoring signals with the first monitoring signals of the transmission channels which belong to the subset monitored by the second monitoring system; repeating the previous steps, wherein a different subset is monitored in each case until second monitoring signals for all subsets of the transmission channels have been received by the second monitoring system and compared with the corresponding first monitoring signals; determining whether the first monitoring signals and the second monitoring signals match, and whether an upper limit for the specific absorption rate has been exceeded.

15 Claims, 4 Drawing Sheets

MONITORING A SPECIFIC ABSORPTION RATE DURING A MAGNETIC RESONANCE TOMOGRAPHY EXAMINATION WITH A MULTI-ELEMENT COIL

CROSS REFERENCE TO RELATED APPLICATIONS

This application claims the benefit DE 10 2023 206 110.4 filed on Jun. 28, 2023, which is hereby incorporated by reference in its entirety.

FIELD

Embodiments relate to a method for monitoring a specific absorption rate of a subject during a magnetic resonance tomography examination with a magnetic resonance tomography system with a multi-element coil with several transmission channels.

BACKGROUND

Magnetic resonance tomography systems (MR systems) with parallel transmission technology are based on the fact that instead of conventionally a high-frequency coil that generates a magnetic field, several independently controlled coil elements of a multi-element coil are used, each of which generates its own magnetic field. The multi-element coil may also be referred to as multi-channel transmission coil. During a magnetic resonance tomography examination, the various transmission channels of the multi-element coil may be controlled in parallel. By way of example here the amplitude and the phase of the generated magnetic (and electrical) radio-frequency fields may be adjusted individually. The overall magnetic field, that acts on a subject, e.g. a patient, is then produced from the individual magnetic fields of the individual coil elements. In this way, the generated magnetic field may be controlled and shaped more precisely and a better image quality may ultimately be achieved.

Several radio-frequency transmission channels are used for this purpose. In the simplest case, these are two transmission channels for two coil elements. However, a system with up to 16 transmission channels are currently used, for example, and higher numbers are conceivable especially in the future. The use of several transmission channels requires precise control and synchronization of the individual channels, however. Furthermore, the use of several transmission channels renders the monitoring of the safety of the subject under examination considerably more complex, both in terms of hardware requirements and also software requirements. Therefore, the radio-frequency waveforms must be monitored precisely both in terms of their amplitude and also in terms of their phase in order to comply with limit values for a local specific absorption rate (SAR) and to prevent burns. The SAR specifies the extent to which MR signals or electromagnetic fields generated by the MR system affect the subject and are absorbed by the subject in the process. At a high (local) intensity, the absorption of MR signals may lead to considerable heating and thus also potentially to burns. Especially in a multi-element coil with several transmission channels, a superposition of the signals generated by the different coil elements may potentially lead to large local signal maxima and thus to major local heating. Typically, the SAR is specified in power per mass.

In order to ensure the safety of the subject under examination, each transmission channel is therefore monitored by two independent monitoring systems. It is known how a local SAR may be determined by monitoring the transmission channels. Two directional couplers may be used to obtain a complete transmitted waveform, each with a forward wave and a reflected wave of a transmitted signal. Thus, due to the desired redundant monitoring, four radio-frequency receivers are required for each transmission channel. For example, for a system with 16 transmission channels, 64 (16 (number of transmission channels)×2 (forward and reflected wave)×2 (redundancy)) radio-frequency receivers are accordingly required. With two monitoring systems in use, the number of radio-frequency receivers required doubles again to a total of 128. Such a high number of radio-frequency receivers is expensive and also complex to implement and use. For example, such a large number of hardware components may increase the probability of failure of the system, as each hardware component may be individually faulty. Accordingly, the overall downtime of the system may also be greater and the maintenance effort is more complex and extensive. For this reason, a cheaper and simpler solution would be desirable.

BRIEF SUMMARY AND DESCRIPTION

The scope of the present disclosure is defined solely by the claims and is not affected to any degree by the statements within this summary. The present embodiments may obviate one or more of the drawbacks or limitations in the related art. Independent of the grammatical term usage, individuals with male, female or other gender identities are included within the term.

Embodiments provide a way to configure the operation of a magnetic resonance tomography system with a multi-element coil in such a way that the safety of a subject under examination may continue to be ensured and maintenance effort and/or costs may be saved.

According to a first aspect, a method for monitoring a specific absorption rate of a subject, for example patient, during a magnetic resonance tomography examination with a magnetic resonance tomography system with a multi-element coil with several transmission channels is provided. The method includes the following steps:

(a) simultaneous monitoring of the transmission channels with a first monitoring system to obtain first monitoring signals;

(b) simultaneously with step (a), monitoring a subset of the transmission channels with a second monitoring system to obtain second monitoring signals;

(c) comparing the second monitoring signals with the first monitoring signals of those transmission channels that belong to the subset monitored by the second monitoring system;

(d) repeating steps (a) through (c), wherein in step (b) a different subset is monitored in each case, until second monitoring signals for all subsets of the transmission channels have been obtained by the second monitoring system and compared with the corresponding first monitoring signals;

(e) determining whether the first monitoring signals and the second monitoring signals are the same, for example within a specified tolerance range, and whether an upper limit for the specific absorption has been exceeded.

The subject may be a person or an animal, for instance. For example, the specific absorption rate may be or include a local specific absorption rate or include a local distribution of the specific absorption rate in the subject. In order to prevent burns, it may be necessary to be able to assess the local effect of the MR signals, as the superposition of the signals may lead to local intensity maxima. Accordingly, the upper limit for the specific absorption rate may refer to a distribution of the specific absorption rate and a constant or locally variable upper limit for the local SAR in each case.

The transmission channels of the multi-element coil are monitored with a first monitoring system and a second monitoring system. Advantageously, all transmission channels are monitored simultaneously by the first monitoring system. This may provide that during a magnetic resonance tomography examination, monitoring of the SAR distribution in the subject may be guaranteed almost non-stop. However, monitoring with only the first monitoring system would have the disadvantage that, for example, in the event of a functional error or complete failure of the first monitoring system, incorrect measured values or no measured values at all (or low measured values corresponding to background noise) could possibly be determined unnoticed. If the SAR values determined were lower than the actually effective SAR values, unnoticed burns could occur. To avoid this, the second monitoring system is also provided. With the second monitoring system, there is an additional safety mechanism that could detect (in step e) if one of the two monitoring systems provides deviating SAR values. Advantageously, however, the second monitoring system only monitors a subset of the transmission channels at any given time. This has the advantage that the second monitoring system for the signal processing may be less complex or require fewer hardware components for the signal processing. Repeating the measurement with different subsets in each case provides that overall all transmission channels are monitored by two monitoring systems. For example, the combination of all subsets of the transmission channels includes all transmission channels or all transmission channels that are monitored by the first monitoring system. The subsets may be chosen in such a way that each transmission channel appears only once in the totality of the subsets. It is possible to be able to identify errors quickly enough due to such a division of the function of the second monitoring system, because a switching between the different subsets is possible with common hardware and the usual switching times are sufficiently fast for this. For example, for common MR systems, it is sufficient if a time scale within which an error is detected is in the order of magnitude of about 100 milliseconds. The exact time scale may depend here on the MR system used and its respective properties. A switching, on the other hand, may happen within an order of magnitude of, for example, an order of magnitude of, for example, 1 millisecond. Therefore, it may be sufficient if the second monitoring system does not monitor every transmission channel at all times, but e.g. cyclically monitors the various subsets of the transmission channels, so that all transmission channels are also monitored by the second monitoring system in the required time scale. Thus, the entire SAR distribution may be monitored by the first monitoring system, that depends for example also on the temporal development of the signals at any given time, because a superposition of the signals also depends on the respective relative phase of the signals. The second monitoring system allows the first monitoring system to be checked selectively and, within the scope of a cycle according to step (d), also in its entirety within the necessary time scale. The comparison may be carried out here within the scope of a defined tolerance range. The tolerance range may be chosen in such a way that background noise and other (unavoidable and/or otherwise acceptable) measurement errors are taken into account. Advantageously, the method may save costs and installation space, because the second monitoring system may be configured to be less complex and thus also less extensive, because signals from all transmission channels do not have to be processed simultaneously. The simpler design of the second monitoring system may also reduce maintenance costs if necessary, that ultimately also increases the availability of the system due to shorter maintenance times.

The method or steps of the method may be repeated continuously throughout the entire magnetic resonance tomography examination. This allows monitoring to be carried out during the entire examination period.

The first and second monitoring signals may be signals that may be used to determine the SAR. The monitoring signals may be directly measured values or, for example, also values derived from measured values. The first monitoring signals and the second monitoring signals may be monitoring signals that correspond to one another. This may simplify a comparison by the expectation being to match the first and second monitoring signals within the scope of measurement accuracy. The first and second monitoring signals may also differ, especially systematically, e.g. by the first measuring system systematically delivering values that are higher by a certain factor. In this case, it may be necessary to convert the values accordingly for a comparison. The monitoring signals may provide values from which a SAR may be derived. For example, the monitoring signals may give a power or a value proportional to a power, e.g. the square of a voltage. For example, a local SAR may be determined from the voltages of the waves generated in the transmission channels. This may be considered equivalent to a distribution of the field strength in the subject, from which the SAR may also be determined.

According to an embodiment, if one of the second monitoring signals deviates from the corresponding monitoring signal of the first monitoring signals, a response measure is initiated, including the output of a warning message and/or the interruption of the magnetic resonance tomography examination. In addition or alternatively, if it is determined that the upper limit for the specific absorption rate is exceeded, for example locally exceeded, a response measure including the output of a warning message and/or the interruption of the magnetic resonance tomography examination is initiated. Advantageously, an item of information determined with the method in respect of a deviation in the two monitoring system from one another and also an exceedance of a fixed upper limit of the SAR may be used to initiate a suitable response. For example, this response may serve to protect the subject, e.g. from possible burns.

According to an embodiment, the second monitoring system includes at least one hardware component that is used by time-division multiplexing to monitor at least two different transmission channels, that each belong to different subsets. The first monitoring system for monitoring the transmission channels includes a hardware component corresponding to at least one hardware component for each of the transmission channels. For example, the at least one hardware component may include one or more of: analog-to-digital converters, radio-frequency mixers, filters, etc. For example, the at least one hardware component may be a hardware component that is commonly used to process and/or forward the monitoring signals. The hardware component may be a signal receiver or a part of a signal receiver. The at least one hardware component may be a printed circuit board, that includes one or more of the cited components. Corresponding hardware for signal processing is typically complex and relatively expensive. Advantageously, this may therefore achieve a cost reduction as well as simplify the entire magnetic resonance tomography system. For example, starting from 32 signals, that have to be forwarded by directional couplers, for example, the 32 signals may be time-division multiplexed to only 2 analog-to-digital converters. Further hardware components in the signal processing chain (radio-frequency mixers, filters, etc.) may therefore also be dispensed with. In terms of price, corresponding time-division multiplexers are usually much cheaper and also less complex. This means that a high safety standard may be achieved with a significant reduction in hardware requirements.

According to an embodiment, the switching in the context of time-division multiplexing is carried out at intervals of at least 0.1 ms, for example at least 0.5 ms, for example from 0.5 to 10 ms, for example 0.5 to 5 ms. While time-division multiplexing is essentially technically possible at very short intervals, a switching at the specified minimum intervals may increase the reliability of the monitoring. With shorter time intervals, it may happen that parts of the signal cannot be transmitted or cannot be detected by the monitoring. A time-division multiplexing with a switching rate in the order of magnitude of a few kilohertz may be provided. The switching times mentioned, especially from 0.5 to 10 ms, for example 0.5 to 5 ms, may provide that a timely response may still be made in the event of an excessively high SAR or a malfunction of one of the monitoring systems. Depending on the system used, a time within which a fault is to be determined should lie in an order of magnitude of around 100 ms. A dead time during the switching of the time-division multiplexing may typically be in the range of a few microseconds, e.g. 1 to 5 microseconds. Therefore, the switching times listed may be sufficiently fast for typical MRI systems. Depending on the system used and its specific characteristics, a more precise definition of the switching times may be provided.

According to an embodiment, for monitoring each subset the second monitoring system uses two identical hardware components for monitoring two different transmission channels at the same time, or more than two identical hardware components for monitoring more than two different transmission channels at the same time, for example in such a way that each of the two hardware components or each more than two hardware components are used by time-division multiplexing for the monitoring of at least two different transmission channels that belong to different subsets in each case. Advantageously, monitoring signals that already contain absolute information about a phase difference may be determined by monitoring two transmission channels at the same time in each case. This means that an exact temporal synchronization of the two monitoring systems is no longer absolutely necessary, because the relative phase of the signals from both monitoring systems no longer has to be determined. This applies, for example, to an evaluation or processing of the monitoring signals with a T-sum matrix, as described herein. This embodiment may therefore be combined with the corresponding embodiments relating to a T-sum matrix and/or monitoring signals based on voltage signals. This embodiment may thus simplify the evaluation or reduce the complexity of the entire monitoring and may increase the independence of the two monitoring systems from each other and thus increase safety.

According to an embodiment, the first and second monitoring signals include voltage values of radio-frequency waveforms of the transmission channels or are derived here from. The first and second monitoring signals are for example based on one product formed by multiplying two of the voltage values together in each case. The power for determining the SAR may be determined from the voltage. For example, the power is directly proportional to the square of the voltage. The SAR may be determined from the square of the voltage values or to base the monitoring directly on the square of the voltage values. The voltage values may include both the voltage of a forward-directed wave and also a reflected wave of the transmission channels in each case.

According to an embodiment, the first and second monitoring signals are components of a T-sum matrix, that are calculated from the voltage values of the radio-frequency waveforms of the transmission channels. For example, the components may be calculated by multiplying two voltage values of the waveforms in each case. For example, the voltage values may be recorded in a time-dependent manner. If the voltage values are determined in a time-dependent manner, information about a relative phase or the phase difference of the waveforms to each other may be drawn from the product of the voltage values of two different waveforms. With the voltages of the respective forward-directed waves, $$U_i^{fwd}(t),$$

and the reflected wave, $$U_i^{ref}(t),$$

a voltage vector may be created with all waveforms:

$$\underline{U}(t) = \begin{pmatrix} U_0^{ref}(t) \\ \cdots \\ U_n^{ref}(t) \\ U_0^{fwd}(t) \\ \cdots \\ U_n^{fwd}(t) \end{pmatrix}$$

The vector for example includes all voltage values, all subsets of the transmission channels or all transmission channels that are monitored by the first monitoring system simultaneously and by the second monitoring system with a time delay. The index i=0, . . . , n stands for the different transmission channels and the variable t, on which the voltages depend, indicates a time dependency.

According to an embodiment, the T-sum matrix is based on a multiplication of a voltage vector by its transposed-conjugated and subsequent integration over time. The voltage vector defined above $$\underline{U}(t) = \begin{pmatrix} U_0^{ref}(t) \\ \cdots \\ U_n^{ref}(t) \\ U_0^{fwd}(t) \\ \cdots \\ U_n^{fwd}(t) \end{pmatrix}$$

may be used for example according to the formula $$T_{sum} = \int dt\, \underline{U(t)} * \text{transpose}(\text{conj}(\underline{U}(t)))$$

in order to obtain the T-sum matrix. All safety-relevant information needed to determine the local SAR may be extracted from the T-sum matrix. The T-sum matrix thus includes for example a main diagonal, in which the voltage values are multiplied by themselves, and the secondary diagonals, in which voltage values of different transmission channels are multiplied with each other. With the secondary diagonals, a phase difference may therefore be determined.

For example, the first monitoring signals include all components of the T-sum matrix and the second monitoring signals of a subset each include a portion of components. The second monitoring signals of all subsets include all components of the T-sum matrix. Thus, in the course of a cycle according to the claim, all elements of the T-sum matrix may be determined and compared with one another at least twice, with the two monitoring systems in each case.

For example, the second monitoring signals of a subset include at least 2 components each of a main diagonal and 2 components each of secondary diagonals of the T-sum matrix. While the main diagonals are each based on a voltage value and may be used as a measure of the power, the components of the secondary diagonals each result from two different voltage values. This allows the relative phase of the waveforms to be deduced from the components of the secondary diagonals, that may also be used to determine local heating. This relative phase may already be determined when measuring two voltage values at the same time, because the components of the secondary diagonals each result from two voltage values. Two components of the main diagonals and the corresponding components of the secondary diagonals may be calculated from two voltage values. Thus, with this embodiment, it is already possible to control the local heating without a phase relationship between the two monitoring systems having to be determined explicitly. If one did not have the values of the secondary diagonals, like for example when determining only one voltage value at once, the effort of monitoring would potentially be greater and the monitoring systems would potentially be less independent of each other, because as a rule a phase adjustment with precise timing (e.g. common clocking) of the two monitoring systems would be necessary to determine the local heating. The respective components of the T-sum matrix determined by the two monitoring systems may be compared as soon as they are available. For example, at least 4 elements or components of the T-sum matrix may be compared at once or with a switching status of the multiplexer. A particularly rapid error detection may thus be enabled. A comparison may be made, for example, on the basis of a percentage deviation with a fixed threshold value of the deviation. An error is ascertained for example if the threshold value is exceeded.

Embodiments provide a computer program including commands that, on execution of the program by a control unit of a magnetic resonance tomography system, trigger the computer to carry out the steps of the method as described herein. All the advantages and features of the method may be transferred similarly to the computer program and vice versa. The computer program may be stored on a computer-readable storage medium, for example a non-volatile storage medium, for instance. The storage medium may be, for example, a hard drive, an SSD, a flash memory, an online server, etc.

Embodiments provide a magnetic resonance tomography system including a multi-element coil with several transmission channels with two sets of directional couplers, a first monitoring system including the first set of directional couplers and a first number of receivers, so that the first monitoring system for each of the directional couplers includes one receiver, a second monitoring system including the second set of directional couplers and a second number of receivers, wherein the second number is less than the first number, wherein at least one, for example at least two, of the receivers of the second monitoring system is connected via signaling by way of a time-division multiplexer to at least two directional couplers, so that the at least one receiver may receive signals from the at least two directional couplers with a time delay, a control unit configured to control the first monitoring system and the second monitoring system and to monitor a specific absorption rate during a magnetic resonance tomography examination using the signals from the two monitoring systems. The control unit is not limited to the fact that different aspects of the control unit must be placed locally in one place and/or designed as a common part. Components of the control unit may also be provided separately from each other. For example, the control unit may include at least one component at the site of the magnetic resonance tomography examination, e.g. an operating console, and an external component, e.g. a server or a computer. The control unit is for example configured to perform the method as described herein. All the advantages and features of the method and of the computer program product may be transferred similarly to the system and vice versa.

According to an embodiment, the second monitoring system of the magnetic resonance tomography system includes at least one hardware component and is configured to process, by time-division multiplexing, signals of at least two different transmission channels with the at least one hardware component. The first monitoring system for monitoring the transmission channels includes a hardware component corresponding to the at least one hardware component for each of the transmission channels. For example, the at least one hardware component may include one or more of: analog-to-digital converters, radio-frequency mixers, filters, etc. For example, the at least one hardware component may be a hardware component that is commonly used to process and/or forward the monitoring signals. The hardware component may be a signal receiver or a part of a signal receiver. The at least one hardware component may be a printed circuit board, that includes one or more of the cited components. For example, the features and advantages mentioned in relation to the method with regard to the at least one hardware component may also be applied here.

According to an embodiment, the system is configured to switch between the directional couplers with the time-division multiplexer at intervals of at least one time corresponding to a few wavelengths, for example at least corresponding to 5 wavelengths, especially for example corresponding to at least 5 wavelengths up to 3 ms. A switching at the cited minimum intervals may increase the reliability of the monitoring. By way of example, with a wave frequency of 1 Mhz and a corresponding wavelength of 1 microsecond, distances of at least a few microseconds, for example at least 5 microseconds, may be provided. The wavelength is for example the wavelength of the waveforms generated by the respective transmission channels. The wavelength is for example a medium wavelength of the waveforms generated by the respective transmission channels. The wavelength is for example a medium wavelength of the waveforms generated by the respective transmission channels.

All the embodiments described herein may be combined with one another, where not explicitly stated otherwise.

DETAILED DESCRIPTION

Figure 1:
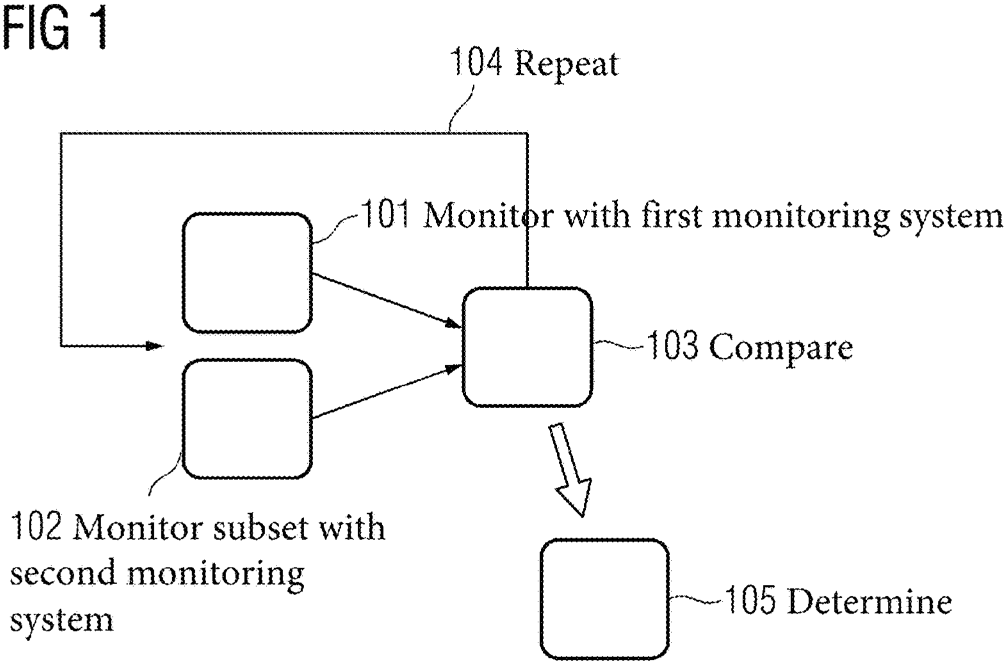
FIG. 1 depicts a flow chart of a method according to an embodiment.

FIG. 1 depicts a flow chart of a method for monitoring a specific absorption rate of a subject 32 according to an embodiment. The method is provided to be carried out during a magnetic resonance tomography examination with a magnetic resonance tomography system 30 with a multi-element coil with several transmission channels. Here, in a first step 101, the transmission channels of the magnetic resonance tomography system 30 are monitored at the same time with a first monitoring system 1 in each case. At the same time as step 101, in step 102 a subset of the transmission channels of the magnetic resonance tomography system 30 is monitored with a second monitoring system 2, in order to obtain second monitoring signals. The first and second monitoring signals are components of a T-sum matrix, that are calculated from voltage values of the radio-frequency waveforms of the transmission channels. The T-sum matrix or the components of the T-sum matrix may be calculated according to the formula:

$$T_{sum}=\int dt\underline{U}(t)^{*}\text{transpose}(\text{conj}(\underline{U}(t)))$$

through a multiplication of a voltage vector by its transposed-conjugated and subsequent integration over time. For example, the voltage vector may have the shape $$\underline{U}(t)=\begin{pmatrix} U_0^{ref}(t) \\ \dots \\ U_n^{ref}(t) \\ U_0^{fwd}(t) \\ \dots \\ U_n^{fwd}(t) \end{pmatrix}$$

with the voltages of the forward-directed waves, Ui fwd(t), and the reflected waves, Ui ref(t), in each case. Here, the first monitoring signals include all components of the T-sum matrix and the second monitoring signals of a subset each include a portion of components. For example, the second monitoring signals of a subset include at least two components each of a main diagonal and two components each of secondary diagonals of the T-sum matrix. This means that a relative phase relationship may also be determined with each subset and it is not necessary to achieve exact timing between the first monitoring signals and the second monitoring signals. In a further step 103, the second monitoring signals are compared with the first monitoring signals of those transmission channels that belong to the subset monitored by the second monitoring system 2. Thus, it may be determined if one of the monitoring systems achieves significantly different measured values than the other, indicating a malfunction of at least one of the monitoring systems. The previous steps 101-103 are now repeated 104 by another subset being monitored in each case in step 102 until second monitoring signals have been obtained for all subsets of the transmission channels by the second monitoring system 2 and compared with the corresponding first monitoring signals. For example, the second monitoring signals of all subsets include all components of the T-sum matrix in total, so that after such a pass, all components of the T-sum matrix have been determined by both monitoring systems and compared between the two monitoring systems. In a further step 105, it is determined whether the first monitoring signals and the second monitoring signals match within the scope of a fixed tolerance range and whether an upper limit for the specific absorption rate has been exceeded. The entire method described is for example repeated continuously during the magnetic resonance tomography examination in order to ensure virtually complete monitoring.

Figure 2:
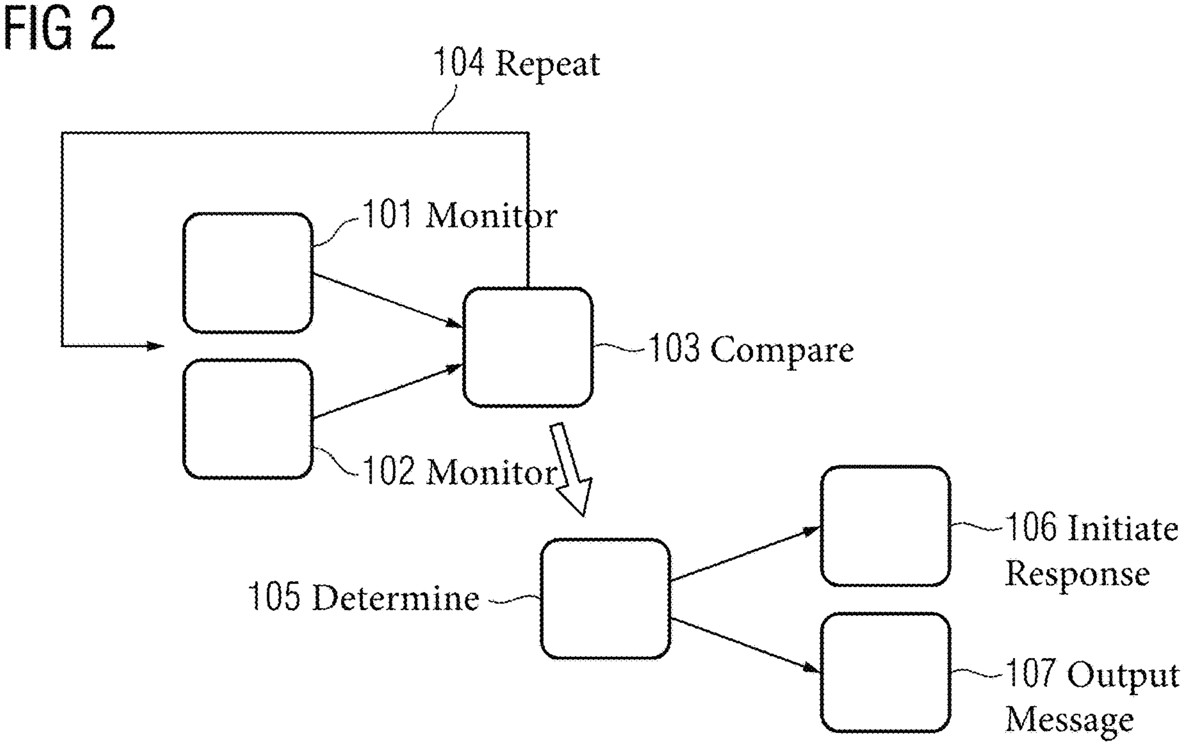
FIG. 2 depicts a flow chart of a method according to an embodiment.

FIG. 2 depicts a flow chart of a method for monitoring a specific absorption rate of a subject 32 according to an embodiment. Steps 101 to 105 may correspond to those of the method shown in FIG. 1. In addition, provision is made here, in a further step 106, with a deviation of one of the second monitoring signals from the corresponding monitoring signal of the first monitoring signals, to initiate a suitable response measure. The response measure may include, for example, the output of a warning message and/or the interruption of the magnetic resonance tomography examination. Furthermore, provision is made in a further step 107, if exceedance of the upper limit for the specific absorption rate is determined (locally), for a response measure to be initiated. The response measure may include, for example, the output of a warning message and/or the interruption of the magnetic resonance tomography examination.

Figure 3:
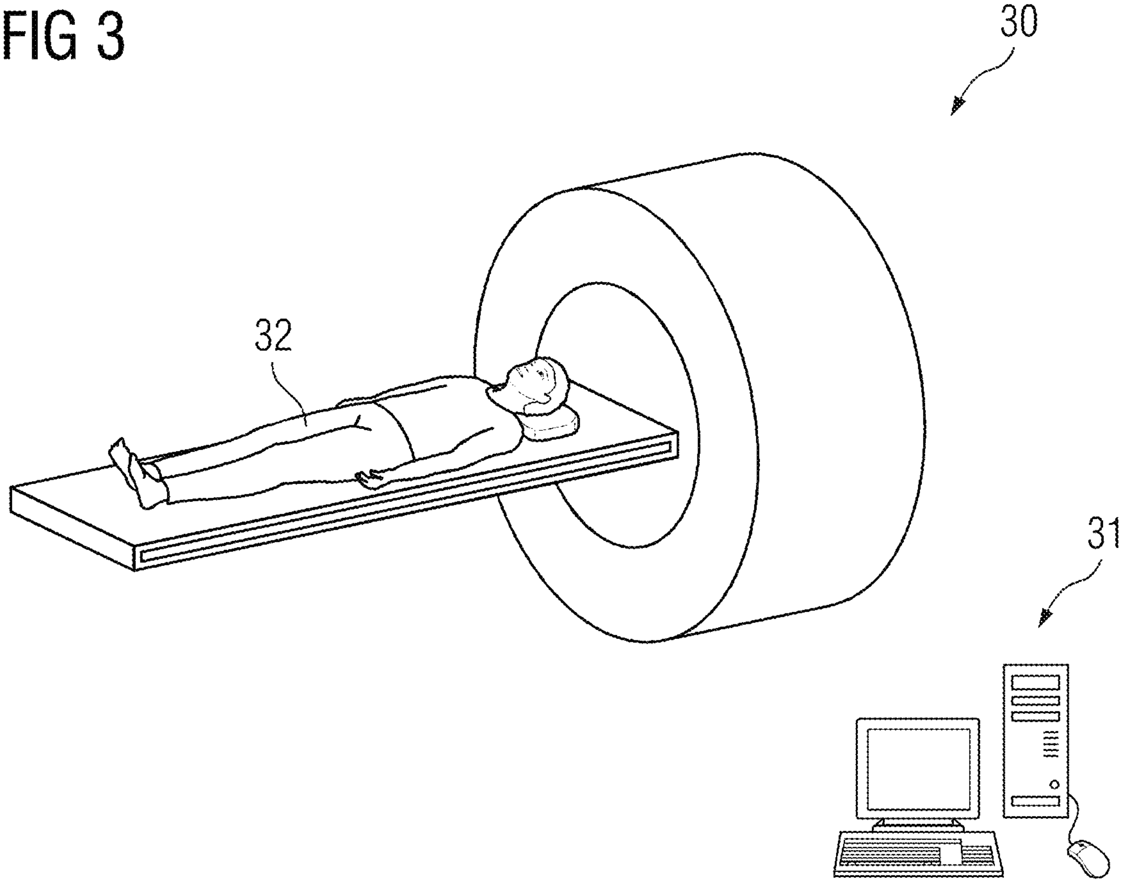
FIG. 3 depicts a magnetic resonance tomography system for examining a subject according to an embodiment.

FIG. 3 depicts a magnetic resonance tomography system 30 for examining a subject 32 according to an embodiment. The magnetic resonance tomography system 30 includes a multi-element coil with several transmission channels with two sets of directional couplers 11, 21 per transmission channel (not shown here). Furthermore, the magnetic resonance tomography system 30 includes a first monitoring system 1 with the first set of directional couplers 11 and a first number of receivers, so that the first monitoring system 1 includes one receiver for each of the directional couplers 11 and a second monitoring system 2 with the second set of directional couplers 21 and a second number of receivers, wherein the second number is lower than the first number. At least one, for example at least two, of the receivers of the second monitoring system 2 is/are connected via signaling to at least two directional couplers 21 by way of a time-division multiplexer, so that the at least one receiver may receive signals from the at least two directional couplers 21 with a time delay. The magnetic resonance tomography system 30 also includes a control unit 31, that is configured to control the first monitoring system 1 and the second monitoring system 2 and to monitor a specific absorption rate during a magnetic resonance tomography examination using the signals from the two monitoring systems. For example, the control unit 31 may be configured to carry out a method as shown in FIG. 1 or 2.

Figure 4:
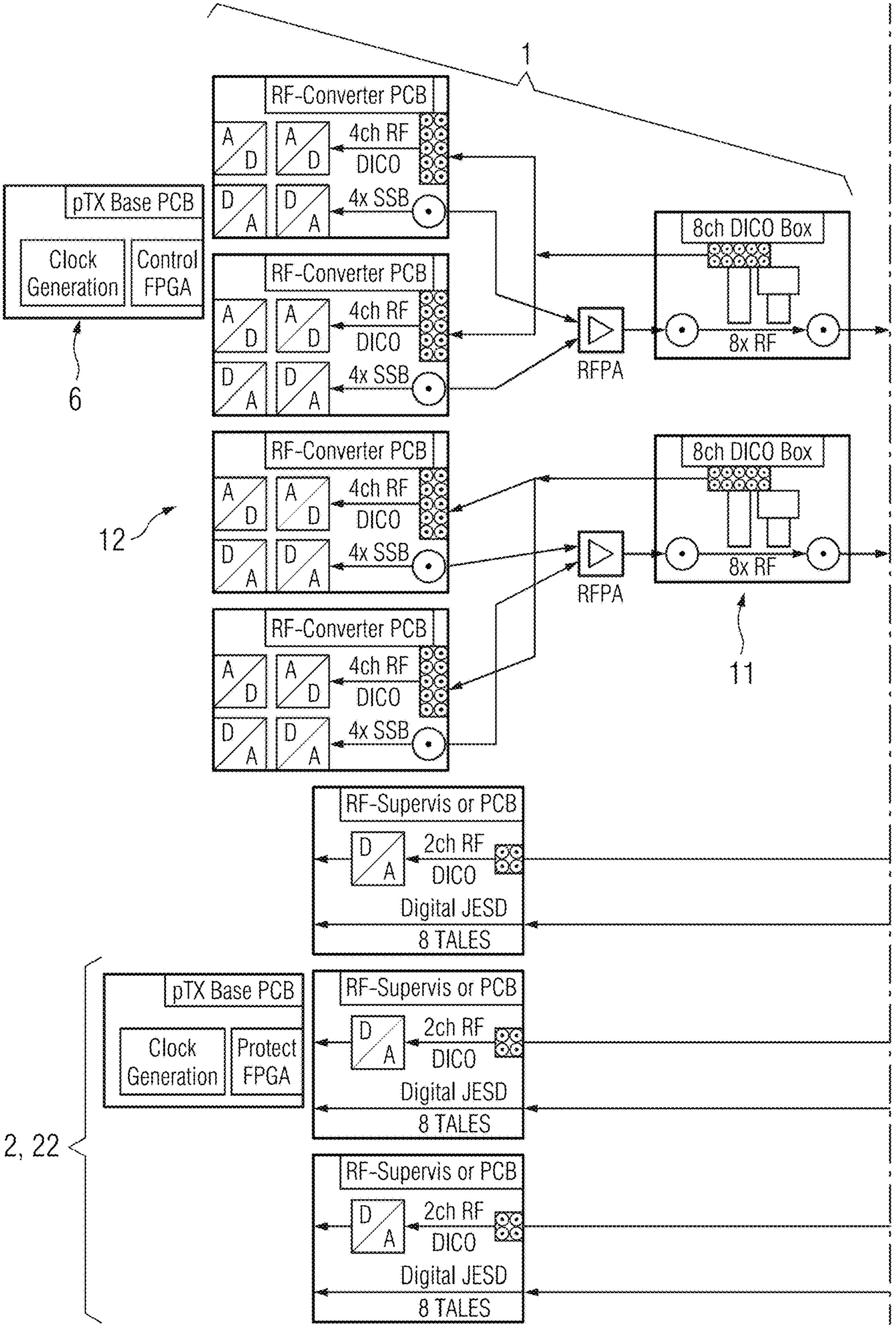
FIG. 4 depicts a component sketch of the two monitoring systems according to an embodiment.
Figure 5:
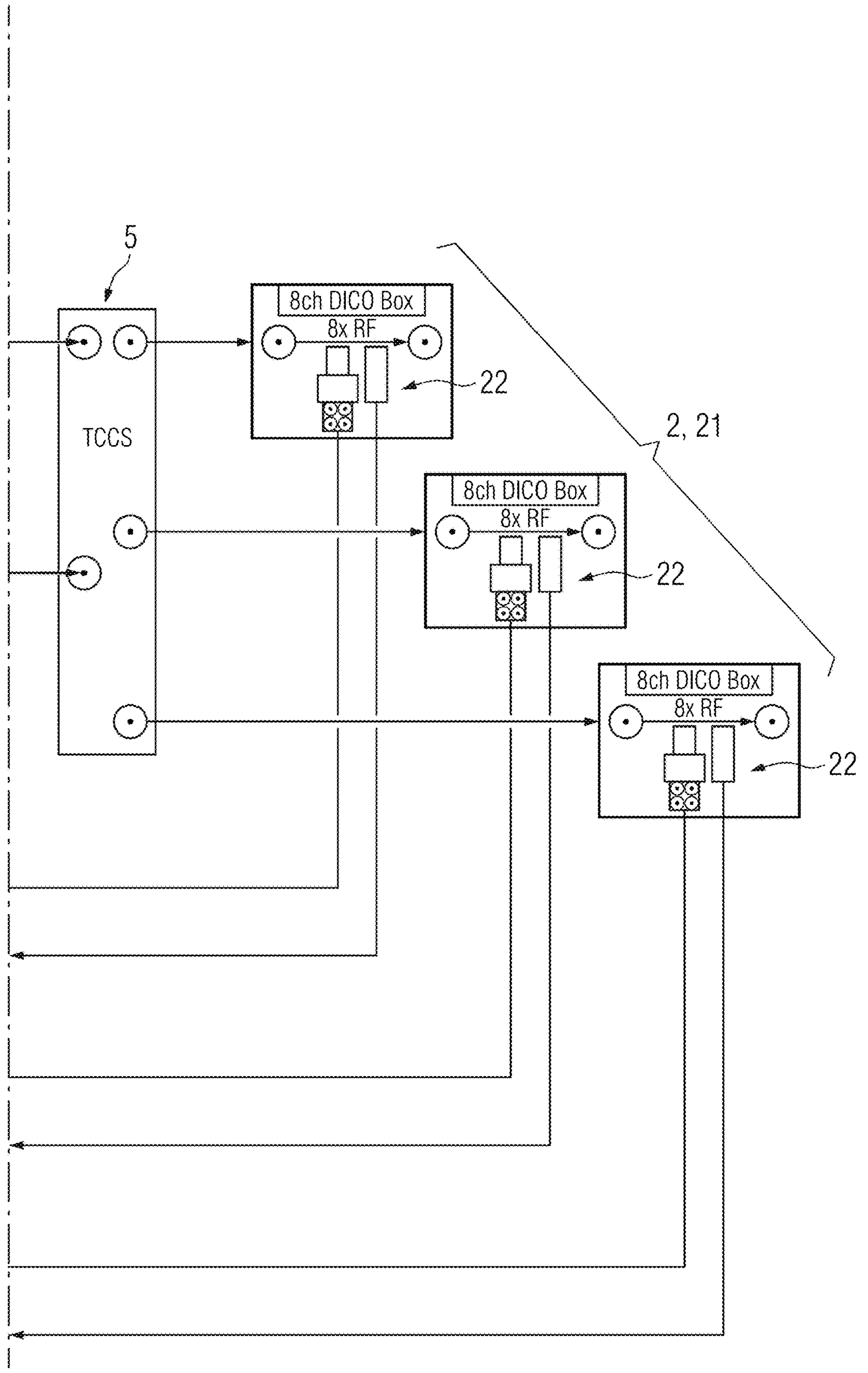
FIG. 5 depicts a component sketch of the two monitoring systems according to an embodiment.

FIG. 4 and FIG. 5 depict component sketches of the two monitoring systems according to an embodiment. In this embodiment, the waveforms are initiated by a control computer 6 and converted into analog signals by printed circuit boards 12, that are also part of the first monitoring system 1.

The signals to be monitored are forwarded to directional couplers 11 of the first monitoring system 1. In this representation each box stands for eight directional couplers 11 or includes eight directional couplers 11. From the directional couplers 11 of the first monitoring system 1, the signals are forwarded back to the printed circuit boards 12 of the first monitoring system 1 and evaluated there. The printed circuit boards include several hardware components for each transmission channel in each case, including several analog-to-digital converters. At the same time, the signals from the transmission channels are routed via a distribution unit 5 to the second monitoring system 2. Here, too, each box stands for 8 directional couplers 21. In this case only 16 directional couplers 21 are required, the distribution unit therefore sends the signals to only 16 of the 24 directional couplers 21 provided here. Surplus directional couplers 21 may be used as an additional reference, for example, that forward a null signal or background noise. For each of the directional couplers 21 of the second monitoring system 2, a time-division multiplexer is provided, that conducts two times three of the signals of the directional couplers 21, corresponding to a subset of the signals, to three printed circuit boards 22 of the second monitoring system 2. Each box shown is designed to process two signals at the same time. The three printed circuit boards 22 of the second monitoring system 2 each include hardware components, such as analog-to-digital converters, corresponding to the hardware components of the printed circuit boards 12 of the first monitoring system 1. The signals are sent for a period of time in the order of magnitude of 1 ms until the multiplexer then forwards the next signals to the printed circuit boards 22. The hardware components of the printed circuit boards 22 are thus used by time-division multiplexing for the monitoring of at least four, 24:(2×3), different subsets. The monitoring by the second monitoring system 2 is carried out in such a way that all signals from the transmission channels are successively routed to the printed circuit boards. This method is repeated cyclically for the duration of the magnetic resonance tomography examination. In principle, it would be conceivable not to monitor part of the matrix twice. By selecting the double-monitored components appropriately, it may still be possible to guarantee sufficient safety.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that the dependent claims may, alternatively, be made to depend in the alternative from any preceding or following claim, whether independent or dependent, and that such new combinations are to be understood as forming a part of the present specification.

While the present disclosure has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A method for monitoring a specific absorption rate of a subject during a magnetic resonance tomography examination with a magnetic resonance tomography system with a multi-element coil with a plurality of transmission channels, the method comprising:

- simultaneous monitoring of the plurality of transmission channels with a first monitoring system to obtain first monitoring signals and monitoring a subset of the plurality of transmission channels with a second monitoring system to obtain second monitoring signals;
- comparing the second monitoring signals with the first monitoring signals of the transmission channels that belong to the subset monitored by the second monitoring system;
- repeating monitoring and comparing, wherein a different subset is monitored in each repetition until second monitoring signals for all subsets of the transmission channels have been received by the second monitoring system and compared with the corresponding first monitoring signals; and
- determining whether the first monitoring signals and the second monitoring signals match within a scope of a specified tolerance range and whether an upper limit for the specific absorption has been exceeded.

2. The method of claim 1, wherein the second monitoring system comprises at least one hardware component that is used by time-division multiplexing for the monitoring of at least two different transmission channels that each belong to different subsets, and wherein the first monitoring system for monitoring the transmission channels comprises a hardware component corresponding to the at least one hardware component for each of the transmission channels.

3. The method of claim 2, further comprising:

- switching between two directional couplers with the time-division multiplexer at intervals of at least one time corresponding to at least five wavelengths.

4. The method of claim 2, wherein the second monitoring system for monitoring each subset uses two identical hardware components for monitoring two different transmission channels at the same time or more than two identical hardware components for monitoring more than two different transmission channels at the same time such that each of the two hardware components or each of the more than two hardware components are used by time-division multiplexing for the monitoring of at least two different transmission channels which belong to different subsets in each case.

5. The method of claim 1, wherein the first monitoring signals and second monitoring signals comprise voltage values of radio-frequency waveforms of the transmission channels or are derived therefrom, wherein the first and second monitoring signals are based on one product each formed by multiplying two of the voltage values together.

6. The method of claim 5, wherein the first and second monitoring signals are components of a T-sum matrix that are calculated from the voltage values of the radio-frequency waveforms of the transmission channels.

7. The method of claim 6, wherein the first monitoring signals comprise all components of the T-sum matrix and the second monitoring signals of a subset each comprise a portion of components, wherein the second monitoring signals of all subsets comprise all components of the T-sum matrix.

8. The method of claim 6, wherein the second monitoring signals of a subset comprise at least 2 components each of a main diagonal and 2 components each of secondary diagonals of the T-sum matrix.

9. The method of claim 6, wherein the T-sum matrix is based on a multiplication of a voltage vector by its transposed-conjugated and subsequent integration over time.

10. The method of claim 1, wherein if one of the second monitoring signals deviates from the corresponding monitoring signal of the first monitoring signals, a response measure is initiated, comprising an output of a warning message and/or an interruption of the magnetic resonance tomography examination.

11. The method of claim 1, wherein if exceedance of the upper limit for the specific absorption rate is determined, a response measure comprising an output of a warning message and/or an interruption of the magnetic resonance tomography examination is initiated.

12. A magnetic resonance tomography system comprising a multi-element coil with a plurality of transmission channels with two sets of directional couplers;

a first monitoring system comprising a first set of directional couplers of the two sets of directional couplers and a first number of receivers, so that the first monitoring system comprises a receiver for each of the directional couplers;

a second monitoring system comprising a second set of directional couplers of the two sets of direction couplers and a second number of receivers, wherein the second number is less than the first number;

wherein at least one of the receivers of the second monitoring system are connected via signaling to at least two directional couplers by way of a time-division multiplexer, so that the at least one receiver may receive signals from the at least two directional couplers with a time delay; and a control unit configured to control the first monitoring system and the second monitoring system and with the signals of the two monitoring systems to monitor a specific absorption rate during a magnetic resonance tomography examination.

13. The magnetic resonance tomography system of claim 12, wherein the control unit is configured to:

simultaneous monitor the plurality of transmission channels by the first monitoring system to obtain first monitoring signals and monitoring a subset of the plurality of transmission channels with the second monitoring system to obtain second monitoring signals;

comparing the second monitoring signals with the first monitoring signals of the transmission channels which belong to the subset monitored by the second monitoring system;

repeating monitoring and comparing, wherein a different subset is monitored in each repetition until second monitoring signals for all subsets of the transmission channels have been received by the second monitoring system and compared with the corresponding first monitoring signals; and determine whether the first monitoring signals and the second monitoring signals match within a scope of a specified tolerance range, and whether an upper limit for the specific absorption has been exceeded.

14. The magnetic resonance tomography system of claim 12, wherein the second monitoring system comprises at least one hardware component and is configured to process, by time-division multiplexing, signals of at least two different transmission channels with the at least one hardware component, wherein the first monitoring system for monitoring the transmission channels comprises a hardware component corresponding to the at least one hardware component for each of the transmission channels.

15. The magnetic resonance tomography system of claim 12, wherein the system is configured, with the time-division multiplexer, to switch between the directional couplers at intervals of from 0.5 to 10 ms.

* * * * *